United States Patent
Dora

(10) Patent No.: US 8,772,842 B2
(45) Date of Patent: Jul. 8, 2014

(54) SEMICONDUCTOR DIODES WITH LOW REVERSE BIAS CURRENTS

(75) Inventor: Yuvaraj Dora, Goleta, CA (US)

(73) Assignee: Transphorm, Inc., Goleta, CA (US)

( * ) Notice: Subject to any disclaimer, the term of this patent is extended or adjusted under 35 U.S.C. 154(b) by 205 days.

(21) Appl. No.: 13/040,524

(22) Filed: Mar. 4, 2011

(65) Prior Publication Data

US 2012/0223319 A1   Sep. 6, 2012

(51) Int. Cl.
*H01L 29/80*   (2006.01)
*H01L 29/20*   (2006.01)
*H01L 31/0328*   (2006.01)
*H01L 29/872*   (2006.01)
*H01L 29/861*   (2006.01)
*H01L 29/66*   (2006.01)

(52) U.S. Cl.
CPC ........... *H01L 29/872* (2013.01); *H01L 29/861* (2013.01); *H01L 29/2003* (2013.01); *H01L 29/66462* (2013.01)
USPC .......... 257/280; 257/284; 257/192; 257/194; 257/256; 257/E29.338

(58) Field of Classification Search
CPC .............. H01L 29/2003; H01L 29/66462; H01L 29/42316; H01L 29/402; H01L 29/7786; H01L 29/872; H01L 29/861; H01L 29/404; H01L 29/66431
USPC .......... 257/192, 194, 76, 256, 280, 284, 288, 257/E29.338
See application file for complete search history.

(56) References Cited

U.S. PATENT DOCUMENTS

| | | | |
|---|---|---|---|
| 4,300,091 A | 11/1981 | Schade, Jr. | |
| 4,645,562 A | 2/1987 | Liao et al. | |
| 4,728,826 A | 3/1988 | Einzinger et al. | |
| 4,821,093 A | 4/1989 | Iafrate et al. | |
| 4,914,489 A | 4/1990 | Awano | |

(Continued)

FOREIGN PATENT DOCUMENTS

| | | |
|---|---|---|
| CN | 1748320 A | 3/2006 |
| CN | 101107713 | 1/2008 |

(Continued)

OTHER PUBLICATIONS

Coffie, R., et al., "Unpassivated p-GaN/AlGaN/GaN HEMTs with 7.1 W/mm at 10 GhZ," Electronic Letters, 39(19):1419-1420, 2003.

(Continued)

*Primary Examiner* — Shouxiang Hu

(74) *Attorney, Agent, or Firm* — Fish & Richardson P.C.

(57) ABSTRACT

A diode is described with a III-N material structure, an electrically conductive channel in the III-N material structure, two terminals, wherein a first terminal is an anode adjacent to the III-N material structure and a second terminal is a cathode in ohmic contact with the electrically conductive channel, and a dielectric layer over at least a portion of the anode. The anode comprises a first metal layer adjacent to the III-N material structure, a second metal layer, and an intermediary electrically conductive structure between the first metal layer and the second metal layer. The intermediary electrically conductive structure reduces a shift in an on-voltage or reduces a shift in reverse bias current of the diode resulting from the inclusion of the dielectric layer. The diode can be a high voltage device and can have low reverse bias currents.

47 Claims, 12 Drawing Sheets

(56) References Cited

U.S. PATENT DOCUMENTS

| | | | |
|---|---|---|---|
| 5,051,618 | A | 9/1991 | Lou |
| 5,329,147 | A | 7/1994 | Vo et al. |
| 5,618,384 | A | 4/1997 | Chan et al. |
| 5,663,091 | A | 9/1997 | Yen et al. |
| 5,705,847 | A | 1/1998 | Kashiwa et al. |
| 5,714,393 | A | 2/1998 | Wild et al. |
| 5,909,103 | A | 6/1999 | Williams |
| 5,998,810 | A | 12/1999 | Hatano et al. |
| 6,008,684 | A | 12/1999 | Ker et al. |
| 6,097,046 | A | 8/2000 | Plumton |
| 6,100,571 | A | 8/2000 | Mizuta et al. |
| 6,316,793 | B1 | 11/2001 | Sheppard et al. |
| 6,373,082 | B1 | 4/2002 | Ohno et al. |
| 6,475,889 | B1 | 11/2002 | Ring |
| 6,486,502 | B1 | 11/2002 | Sheppard et al. |
| 6,504,235 | B2 * | 1/2003 | Schmitz et al. ............... 257/649 |
| 6,515,303 | B2 | 2/2003 | Ring |
| 6,548,333 | B2 | 4/2003 | Smith |
| 6,583,454 | B2 | 6/2003 | Sheppard et al. |
| 6,586,781 | B2 | 7/2003 | Wu et al. |
| 6,649,497 | B2 | 11/2003 | Ring |
| 6,727,531 | B1 | 4/2004 | Redwing et al. |
| 6,777,278 | B2 | 8/2004 | Smith |
| 6,849,882 | B2 | 2/2005 | Chavarkar et al. |
| 6,867,078 | B1 | 3/2005 | Green et al. |
| 6,946,739 | B2 | 9/2005 | Ring |
| 6,979,863 | B2 | 12/2005 | Ryu |
| 6,982,204 | B2 | 1/2006 | Saxler et al. |
| 7,030,428 | B2 | 4/2006 | Saxler |
| 7,045,404 | B2 | 5/2006 | Sheppard et al. |
| 7,071,498 | B2 | 7/2006 | Johnson et al. |
| 7,084,475 | B2 | 8/2006 | Shelton et al. |
| 7,125,786 | B2 | 10/2006 | Ring et al. |
| 7,126,212 | B2 | 10/2006 | Enquist et al. |
| 7,161,194 | B2 | 1/2007 | Parikh et al. |
| 7,170,111 | B2 | 1/2007 | Saxler |
| 7,230,284 | B2 | 6/2007 | Parikh et al. |
| 7,238,560 | B2 | 7/2007 | Sheppard et al. |
| 7,253,454 | B2 | 8/2007 | Saxler |
| 7,265,399 | B2 | 9/2007 | Sriram et al. |
| 7,268,375 | B2 | 9/2007 | Shur et al. |
| 7,304,331 | B2 | 12/2007 | Saito et al. |
| 7,321,132 | B2 | 1/2008 | Robinson et al. |
| 7,326,971 | B2 | 2/2008 | Harris et al. |
| 7,332,795 | B2 | 2/2008 | Smith et al. |
| 7,364,988 | B2 | 4/2008 | Harris et al. |
| 7,388,236 | B2 | 6/2008 | Wu et al. |
| 7,419,892 | B2 | 9/2008 | Sheppard et al. |
| 7,432,142 | B2 | 10/2008 | Saxler et al. |
| 7,456,443 | B2 | 11/2008 | Saxler et al. |
| 7,465,967 | B2 | 12/2008 | Smith et al. |
| 7,501,669 | B2 | 3/2009 | Parikh et al. |
| 7,544,963 | B2 | 6/2009 | Saxler |
| 7,547,925 | B2 | 6/2009 | Wong et al. |
| 7,548,112 | B2 | 6/2009 | Sheppard |
| 7,550,783 | B2 | 6/2009 | Wu et al. |
| 7,550,784 | B2 | 6/2009 | Saxler et al. |
| 7,566,918 | B2 | 7/2009 | Wu et al. |
| 7,573,078 | B2 | 8/2009 | Wu et al. |
| 7,592,211 | B2 | 9/2009 | Sheppard et al. |
| 7,598,108 | B2 | 10/2009 | Li et al. |
| 7,612,390 | B2 | 11/2009 | Saxler et al. |
| 7,615,774 | B2 | 11/2009 | Saxler |
| 7,638,818 | B2 | 12/2009 | Wu et al. |
| 7,678,628 | B2 | 3/2010 | Sheppard et al. |
| 7,692,263 | B2 | 4/2010 | Wu et al. |
| 7,709,269 | B2 | 5/2010 | Smith et al. |
| 7,709,859 | B2 | 5/2010 | Smith et al. |
| 7,745,851 | B2 | 6/2010 | Harris |
| 7,755,108 | B2 | 7/2010 | Kuraguchi |
| 7,759,700 | B2 | 7/2010 | Ueno et al. |
| 7,777,252 | B2 | 8/2010 | Sugimoto et al. |
| 7,777,254 | B2 | 8/2010 | Sato |
| 7,795,642 | B2 | 9/2010 | Suh et al. |
| 7,812,369 | B2 | 10/2010 | Chini et al. |
| 7,851,825 | B2 | 12/2010 | Suh et al. |
| 7,855,401 | B2 | 12/2010 | Sheppard et al. |
| 7,875,537 | B2 | 1/2011 | Suvorov et al. |
| 7,875,907 | B2 | 1/2011 | Honea et al. |
| 7,875,914 | B2 | 1/2011 | Sheppard |
| 7,884,394 | B2 | 2/2011 | Wu et al. |
| 7,884,395 | B2 | 2/2011 | Saito |
| 7,892,974 | B2 | 2/2011 | Ring et al. |
| 7,893,500 | B2 | 2/2011 | Wu et al. |
| 7,898,004 | B2 | 3/2011 | Wu et al. |
| 7,901,994 | B2 | 3/2011 | Saxler et al. |
| 7,906,799 | B2 | 3/2011 | Sheppard et al. |
| 7,915,643 | B2 | 3/2011 | Suh et al. |
| 7,915,644 | B2 | 3/2011 | Wu et al. |
| 7,919,791 | B2 | 4/2011 | Flynn et al. |
| 7,928,475 | B2 | 4/2011 | Parikh et al. |
| 7,939,391 | B2 | 5/2011 | Suh et al. |
| 7,948,011 | B2 | 5/2011 | Rajan et al. |
| 7,955,918 | B2 | 6/2011 | Wu et al. |
| 7,960,756 | B2 | 6/2011 | Sheppard et al. |
| 7,965,126 | B2 | 6/2011 | Honea et al. |
| 7,985,986 | B2 | 7/2011 | Heikman et al. |
| 8,049,252 | B2 | 11/2011 | Smith et al. |
| 8,138,529 | B2 | 3/2012 | Wu |
| 8,193,562 | B2 | 6/2012 | Suh et al. |
| 8,237,198 | B2 | 8/2012 | Wu et al. |
| 8,289,065 | B2 | 10/2012 | Honea et al. |
| 8,344,424 | B2 | 1/2013 | Suh et al. |
| 8,389,977 | B2 | 3/2013 | Chu et al. |
| 8,390,000 | B2 | 3/2013 | Chu et al. |
| 8,455,931 | B2 | 6/2013 | Wu |
| 8,493,129 | B2 | 7/2013 | Honea et al. |
| 8,508,281 | B2 | 8/2013 | Honea et al. |
| 8,519,438 | B2 | 8/2013 | Mishra et al. |
| 8,531,232 | B2 | 9/2013 | Honea et al. |
| 8,541,818 | B2 | 9/2013 | Wu et al. |
| 8,592,974 | B2 | 11/2013 | Wu |
| 8,598,937 | B2 | 12/2013 | Lal et al. |
| 8,624,662 | B2 | 1/2014 | Parikh et al. |
| 8,633,518 | B2 | 1/2014 | Suh et al. |
| 2001/0032999 | A1 | 10/2001 | Yoshida |
| 2001/0040247 | A1 | 11/2001 | Ando et al. |
| 2002/0036287 | A1 | 3/2002 | Yu et al. |
| 2002/0121648 | A1 | 9/2002 | Hsu et al. |
| 2002/0167023 | A1 | 11/2002 | Chavarkar et al. |
| 2003/0003724 | A1 | 1/2003 | Uchiyama et al. |
| 2003/0006437 | A1 | 1/2003 | Mizuta et al. |
| 2003/0020092 | A1 | 1/2003 | Parikh et al. |
| 2004/0041169 | A1 | 3/2004 | Ren et al. |
| 2004/0061129 | A1 | 4/2004 | Saxler et al. |
| 2004/0164347 | A1 | 8/2004 | Zhao et al. |
| 2005/0001235 | A1 | 1/2005 | Murata et al. |
| 2005/0077541 | A1 | 4/2005 | Shen et al. |
| 2005/0133816 | A1 | 6/2005 | Fan et al. |
| 2005/0189561 | A1 | 9/2005 | Kinzer et al. |
| 2005/0189562 | A1 | 9/2005 | Kinzer et al. |
| 2005/0194612 | A1 | 9/2005 | Beach |
| 2005/0253168 | A1 | 11/2005 | Wu et al. |
| 2005/0274977 | A1 | 12/2005 | Saito et al. |
| 2006/0011915 | A1 | 1/2006 | Saito et al. |
| 2006/0043499 | A1 | 3/2006 | De Cremoux et al. |
| 2006/0060871 | A1 | 3/2006 | Beach |
| 2006/0076677 | A1 | 4/2006 | Daubenspeck et al. |
| 2006/0102929 | A1 | 5/2006 | Okamoto et al. |
| 2006/0108602 | A1 | 5/2006 | Tanimoto |
| 2006/0108605 | A1 | 5/2006 | Yanagihara et al. |
| 2006/0121682 | A1 | 6/2006 | Saxler |
| 2006/0124962 | A1 | 6/2006 | Ueda et al. |
| 2006/0157729 | A1 | 7/2006 | Ueno et al. |
| 2006/0186422 | A1 | 8/2006 | Gaska et al. |
| 2006/0189109 | A1 | 8/2006 | Fitzgerald |
| 2006/0202272 | A1 | 9/2006 | Wu et al. |
| 2006/0220063 | A1 | 10/2006 | Kurachi |
| 2006/0226442 | A1 * | 10/2006 | Zhang et al. ................. 257/192 |
| 2006/0255364 | A1 | 11/2006 | Saxler |
| 2006/0289901 | A1 | 12/2006 | Sheppard et al. |
| 2007/0007547 | A1 | 1/2007 | Beach |
| 2007/0018187 | A1 | 1/2007 | Lee et al. |
| 2007/0018199 | A1 | 1/2007 | Sheppard et al. |

(56) References Cited

U.S. PATENT DOCUMENTS

| | | |
|---|---|---|
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra et al. |
| 2009/0085065 A1 | 4/2009 | Mishra et al. |
| 2009/0121775 A1 | 5/2009 | Ueda et al. |
| 2009/0140262 A1* | 6/2009 | Ohki et al. ............ 257/76 |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0140660 A1 | 6/2010 | Wu et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0244087 A1 | 9/2010 | Horie et al. |
| 2010/0264461 A1 | 10/2010 | Rajan et al. |
| 2010/0288998 A1 | 11/2010 | Kikuchi et al. |
| 2011/0006346 A1 | 1/2011 | Ando et al. |
| 2011/0012110 A1 | 1/2011 | Sazawa et al. |
| 2011/0249359 A1 | 10/2011 | Mochizuki et al. |
| 2012/0168822 A1 | 7/2012 | Matsushita |
| 2012/0193638 A1 | 8/2012 | Keller et al. |
| 2012/0211800 A1 | 8/2012 | Boutros |
| 2012/0217512 A1 | 8/2012 | Renaud |
| 2012/0315445 A1 | 12/2012 | Mizuhara et al. |

FOREIGN PATENT DOCUMENTS

| | | |
|---|---|---|
| CN | 101312207 | 11/2008 |
| CN | 101897029 A | 11/2010 |
| CN | 102017160 A | 4/2011 |
| CN | 103477543 | 12/2013 |
| CN | 103493206 | 1/2014 |
| EP | 1 998 376 | 12/2008 |
| JP | 11-224950 | 8/1999 |
| JP | 2004-260114 | 9/2004 |
| JP | 2006-032749 | 2/2006 |
| JP | 2010087076 | 4/2010 |
| TW | 200947703 | 11/2009 |
| TW | 201010076 | 3/2010 |
| TW | 201027759 | 7/2010 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/076076 | 6/2009 |
| WO | WO 2009/132039 | 10/2009 |
| WO | WO 2010/068554 | 6/2010 |
| WO | WO 2010/132587 | 11/2010 |
| WO | WO 2011/031431 | 3/2011 |
| WO | WO 2011/072027 | 6/2011 |

OTHER PUBLICATIONS

Karmalkar, S. and Mishra U.K., "Enhancement of breakdown voltage in AlGaN/GaN high electron mobility transistors using a field plate," IEEE Transactions on Electron Devices, 48(8):1515-1521, 2001.

Lee, K.P., et al, "Self-aligned process for emitter- and base-regrowth GaN HBTs and BJTs," Solid-State Electronics, 45:243-247, 2001.

Yoshida, S., "AlGan/GaN power FET," Furukawa Review, 21:7-11, 2002.

Authorized officer Kwan Sik Sul, International Search Report and Written Opinion in PCT/US2011/063975, mailed May 18, 2012, 8 pages.

Authorized officer Sang-Taek Kim, International Search Report and Written Opinion in PCT/US2011/061407, mailed May 22, 2012, 10 pages.

Authorized officer Kwan Sik Sul, International Search Report and Written Opinion in PCT/US2012/023160, mailed May 24, 2012, 9 pages.

Authorized officer Nora Lindner, International Preliminary Report on Patentability in PCT/US2010/059486, mailed on Jun. 21, 2012, 6 pages.

Authorized officer Jeongmin Choi, International Search Report and Written Opinion in PCT/US2012/027146, mailed Sep. 24, 2012, 12 pages.

Napierala, et al., "Selective GaN Epitaxy on Si(111) Substrates Using Porous Aluminum Oxide Buffer Layers," J. Electrochem. Soc., 2006, 153(2):G125-G127.

SIPO First Office Action for Chinese Application No. 200980114639.X, issued May 14, 2012, 13 pages.

TW Search Report and Action for Taiwan Invention Application No. 098132132, issued Dec. 6, 2012, 8 pages.

Zhanghong Content, Shanghai Institute of Metallurgy, Chinese Academy of Sciences "Two-dimensional Electron Gas and High Electron Mobility Transistor (HEMT)," Dec. 31, 1984, 17 pages.

Authorized officer Keon Hyeong Kim, International Search Report and Written Opinion in PCT/US2008/076160, mailed Mar. 18, 2009, 11 pages.

Authorized officer Simin Baharlou International Preliminary Report on Patentability in PCT/US2008/076160, mailed Mar. 25, 2010, 6 pages.

Authorized officer Sung Hee Kim, International Search Report and Written Opinion in PCT/US2009/057554, mailed May 10, 2010, 13 pages.

(56) References Cited

OTHER PUBLICATIONS

Authorized officer Gijsbertus Beijer, International Preliminary Report on Patentability in PCT/US2009/057554, mailed Mar. 29, 2011, 7 pages.
Authorized officer Sung Chan Chung, International Search Report and Written Opinion in PCT/US2010/021824, mailed Aug. 23, 2010, 9 pages.
Authorized officer Beate Giffo-Schmitt, International Preliminary Report on Patentability in PCT/US2010/021824, mailed Aug. 9, 2011, 6 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Mar. 24, 2010, 6 pages.
Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, mailed Mar. 25, 2010, 5 pages.
Authorized officer Keon Kyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability in PCT/US2009/041304, mailed Nov. 4, 2010, 8 pages.
Authorized officer Cheon Whan Cho, International Search Report and Written Opinion in PCT/US2009/066647, mailed Jul. 1, 2010, 16 pages.
Authorized officer Athina Nickitas-Etienne, International Preliminary Report on Patentability in PCT/US2009/066647, mailed Jun. 23, 2011, 12 pages.
Authorized officer Sang Ho Lee, International Search Report and Written Opinion in PCT/US2010/059486, mailed Jul. 26, 2011, 9 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 11 pages.
SIPO First Office Action for Application No. 200880120050.6, Aug. 2, 2011, 8 pages.
Planar, Low Switching Loss, Gallium Nitride Devices for Power Conversion Applications, SBIR N121-090 (Navy), 3 pages.
Ando et al., "10-W/mm AlGaN-GaN HFET with a field modulating plate," IEEE Electron Device Letters, May 2003, 24(5):289-291.
Arulkumaran et al., "Surface passivation effects on AlGaN/GaN high-electron-mobility transistors with $SiO_2$, $Si_3N_4$, and silicon oxynitride," Applied Physics Letters, Jan. 26, 2004, 84(4): 613-615.

Chen et al., "High-performance AlGaN/GaN lateral field-effect rectifiers compatible with high electron mobility transistors," 2008, Applied Physics Letters, 92, 253501-1-3.
Chu et al., "1200-V normally off GaN-on-Si field-effect transistors with low dynamic on-resistance," IEEE Electron Device Letters, 2011, 32(5): 632-634.
Coffie, R.L., "Characterizing and suppressing DC-to-RF dispersion in AlGaN/GaN high electron mobility transistors," 2003, PhD Thesis, University of California, Santa Barbara, 169 pages.
Dora, Y., "Understanding material and process limits for high breakdown voltage AlGaN/GaN HEMs," 2006, PhD Thesis, University of California, Santa Barbara, 157 pages.
Dora et al., "$ZrO_2$ gate dielectrics produced by ultraviolet ozone oxidation for GaN and AlGaN/GaN transistors," Mar./Apr. 2006, J. Vac. Sci. Technol. B, 24(2)575-581.
Dora et al., "High breakdown voltage achieved on AlGaN/GaN HEMTs with integrated slant field plates," Sep. 9, 006, IEEE Electron Device Letters, 27(9):713-715.
Fanciulli et al., "Structural and electrical properties of $HfO_2$ films grown by atomic layer deposition on Si, Ge, GaAs and GaN," 2004, Mat. Res. Soc. Symp. Proc., 786:E6.14.1-E6.14.6.
Green et al, "The effect of surface passivation on the microwave characteristics of undoped AlGaN/GaN HEMT's," IEEE Electron Device Letters, Jun. 2000, 21(6):268-270.
Gu et al., "AlGaN/GaN MOS transistors using crystalline ZrO2 as gate dielectric," 2007, Proceedings of SPIE, vol. 6473, 64730S, 8 pages.
Higashiwaki et al., "AlGaN/GaN heterostructure field-effect transistors on 4H-SiC Substrates with Current-Gain Cutoff Frequency of 190 GHz," Applied Physics Express, 2008, 1:021103-1-3.
Hwang, J., "Effects of a molecular beam epitaxy grown AlN passivation layer on AlGaN/GaN heterojunction field effect transistors," Solid-State Electronics, 2004, 48:363-366.
Im et al., "Normally off GaN MOSFET based on AlGaN/GaN heterostructure with extremely high 2DEG density grown on silicon substrate," IEEE Electron Device Letters, 2010, 31(3):192-194.
Karmalkar and Mishra, "Very high voltage AlGaN/GaN high electron mobility transistors using a field plate deposited on a stepped insulator," Solid State Electronics, 2001, 45:1645-1652.
Keller et al., "GaN-GaN junctions with ultrathin AlN interlayers: expanding heterojunction design," Applied Physics Letters, 2002, 80(23):4387-4389.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Khan et al, "AlGaN/GaN metal oxide semiconductor heterostructure field effect transistor," IEEE Electron Device Letters, 2000, 21(2):63-65.
Kim, D.H., "Process development and device characteristics of AlGaN/GaN HEMTs for high frequency applications," 2007, PhD Thesis, University of Illinois, Urbana-Champaign, 120 pages.
Kumar et al., "High transconductance enhancement-mode AlGaN/GaN HEMTs on SiC substrate," Electronics Letters, 2003, 39(24):1758-1760.
Kuraguchi et al., "Normally-off GaN-MISFET with well-controlled threshold voltage," Phys. Stats. Sol., 2007, 204(6):2010-2013.
Lanford et al, "Recessed-gate enhancement-mode GaN HEMT with high threshold voltage," 2005, Electronics Letters, vol. 41, No. 7, 2 pages, Online No. 20050161.
Mishra et al., "AlGaN/GaN HEMTs—an overview of device operation and applications," Proceedings of the IEEE, 2002, 90(6):1022-1031.
Mishra et al., "N-face high electron mobility transistors with low buffer leakage and low parasitic resistance," U.S. Appl. No. 60/908,914, filed Mar. 29, 2007, 21 pages.
Mishra et al., "Polarization-induced barriers for n-face nitride-based electronics," U.S. Appl. No. 60/940,052, filed May 24, 2007, 29 pages.
Mishra et al., "Growing N-polar III-nitride Structures," U.S. Appl. No. 60/972,467, filed Sep. 14, 2007, 7 pages.

(56) References Cited

OTHER PUBLICATIONS

Nanjo et al., "Remarkable breakdown voltage enhancement in AlGaN channel high electron mobility transistors," Applied Physics Letters, 2008, 92:263502-1-3.
Ota and Nozawa, "AlGaN/GaN recessed MIS-Gate HFET with high threshold-voltage normally-off operation for power electronics applications," IEEE Electron Device Letters, 2008, 29(7):668-670.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Palacios et al., "Nitride-based high electron mobility transistors with a GaN spacer," Applied Physics Letters, 2006, 89:073508-1-3.
Palacios et al., "AlGaN/GaN HEMTs with an InGaN-based back-barrier," Device Research Conference Digest, 200, DRC '05 63rd, Jun. 2005, pp. 181-182.
Palacios et al., "AlGaN/GaN high electron mobility transistors with InGaN back-barriers," IEEE Electron Device Letters, 2006, 27(1):13-15.
Pei et al., "Effect of dielectric thickness on power performance of AlGaN/GaN HEMTs," IEEE Electron Device Letters, 2009, 30:4:313-315.
Rajan et al, "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Rajan et al., "Advanced transistor structures based on N-face GaN," 32M International Symposium on Compound Semiconductors (ISCS), Sep. 18-22, 2005, Europa-Park Rust, Germany, 2 pages.
Saito et al., "Recessed-gate structure approach toward normally off high-voltage AlGaN/GaN HEMT for power electronics applications," 2006, IEEE Transactions on Electron Device, 53(2):356-362.
Shelton et al., "Selective area growth and characterization of AlGaN/GaN heterojunction bipolar transistors by metalorganic chemical vapor deposition," IEEE Transactions on Electron Devices, 2001, 48(3):490-494.
Shen L., "Advanced polarization-based design of AlGaN/GaN HEMTs," 2004, PhD Thesis, University of California, Santa Barbara, 192 pages.
Sugiura et al., "Enhancement-mode n-channel GaN MOSFETs fabricated on p-GaN using $HfO_2$ as gate oxide," 2007, Electronics Letters, vol. 43, No. 17, 2 pages.
Suh et al, "High breakdown enhancement mode GaN-based HEMTs with integrated slant field plate," U.S. Appl. No. 60/822,886, filed Aug. 18,2006, 16 pages.
Suh et al, "III-nitride devices with recessed gates," U.S. Appl. No. 60/972,481, filed Sep. 14, 2007, 18 pages.
Suh, et al. "High-breakdown enhancement-mode AlGaN/GaN HEMTs with integrated slant field-plate," Electron Devices Meeting, 2006, IEDM '06. International (2006), 3 pages.
Tipirneni et al., "Silicon dioxide-encapsulated high-voltage AlGaN/GaN HFETs for power-switching applications," IEEE Electron Device Letters, 28(9):784-786.
Vetury et al., "Direct measurement of gate depletion in high breakdown (405V) Al/GaN/GaN heterostructure field effect transistors," IEDM 98:55-58.
Wang et al., "Comparison of the effect of gate dielectric layer on 2DEG carrier concentration in strained AlGaN/GaN heterostructure," 2005, Mater. Res. Soc. Symp. Proc., 831:E8.20.1-E8.20.6.
Wang, et al., "Enhancement-mode $Si_3N_4$/AlGan/Gan MISHFETs," IEEE Electron Device Letters, 2006, 27(10):793-795.
Wu et al., "A 97.8% efficient GaN HEMT boost converter with 300-W output power at 1 MHz," IEEE Electron Device Letters, 2008, 29(8):824-826.
Wu, Y., AlGaN/GaN micowave power high-mobility transistors, 1997, PhD Thesis, University of California, Santa Barbara, 134 pages.
Zhang, N., "High voltage GaN HEMTs with low on-resistance for switching applications," 2002, PhD Thesis, University of California, Santa Barbara, 166 pages.

U.S. Appl. No. 13/019,150, filed Feb. 1, 2011, Enhancement Mode Gallium Nitride Power Devices.
U.S. Appl. No. 12/209,581, filed Sep. 12, 2008, III-Nitride Bidirectional Switches.
U.S. Appl. No. 12/324,574, filed Nov. 26, 2008, Insulated Gate E-Mode Transistors.
U.S. Appl. No. 12/108,449, filed Apr. 23, 2008, Enhancement Mode III-N HEMPTs.
U.S. Appl. No. 12/556,438, filed Sep. 9, 2009, Inductive Load Power Switching Circuits.
U.S. Appl. No. 13/008,874, filed Jan. 18, 2011, Semiconductor Heterostructure Diodes.
U.S. Appl. No. 12/611,018, filed Nov. 2, 2009, Package Configurations for Low EMI Circuits.
U.S. Appl. No. 13/406,723, filed Feb. 28, 2012, Enhancement Mode Gallium Nitride Power Devices.
U.S. Appl. No. 13/723,753, filed Dec. 21, 2012, Gallium Nitride Power Devices.
U.S. Appl. No. 13/164,109, filed Jun. 20, 2011, Bridge Circuits and their Components.
U.S. Appl. No. 13/618,502, filed Sep. 14, 2012, Inductive Load Power Switching Circuits.
U.S. Appl. No. 13/618,726, filed Sep. 14, 2012, Inductive Load Power Switching Circuits.
U.S. Appl. No. 13/533,339, filed Jun. 26, 2012, Semiconductor Heterostructure Diodes.
U.S. Appl. No. 13/355,885, filed Jan. 23, 2012, Package Configurations for Low EMI Circuits.
U.S. Appl. No. 12/635,405, filed Dec. 10, 2009, Reverse Side Engineered III-Nitride Devices.
U.S. Appl. No. 12/550,140, filed Aug. 28, 2009, Semiconductor Devices with Field Plates.
U.S. Appl. No. 12/701,458, filed Feb. 5, 2010, Semiconductor Electronic Components and Circuits.
U.S. Appl. No. 13/269,367, filed Oct. 7, 2011, High Power Semiconductor Electronic Components with Increased Reliability.
Authorized officer Sebastian Moehl, European Search Report in EP 10 81 5813, mailed Mar. 12, 2013, 9 pages.
Authorized officer Tae Hoon Kim, International Search Report and Written Opinion in PCT/US2013/035837, mailed Jul. 30, 2013, 9 pages.
Authorized officer Lingfei Bai, International Preliminary Report on Patentability in PCT/US2011/061407, mailed Jun. 6, 2013, 7 pages.
Authorized officer Simin Baharlou, International Preliminary Report on Patentability in PCT/US2011/063975, mailed Jun. 27, 2013, 5 pages.
Authorized officer Simin Baharlou, International Preliminary Report on Patentability in PCT/US2012/023160, mailed Aug. 15, 2013, 6 pages.
Authorized officer Athina Nickitas-Etienne, International Preliminary Report on Patentability in PCT/US2012/027146, mailed Sep. 19, 2013, 9 pages.
U.S. Appl. No. 11/856,695, filed Sep. 17, 2007, Gallium Nitride Diodes and Integrated Components.
U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 13/954,772, filed Jul. 30, 2013, Enhancement Mode III-N HEMTs.

(56) References Cited

OTHER PUBLICATIONS

U.S. Appl. No. 61/099,451, filed Sep. 23, 2008, Inductive Load Power Switching Circuits.
U.S. Appl. No. 13/959,483, filed Aug. 5, 2013, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low EMI Circuits.
U.S. Appl. No. 13/756,284, filed Jan. 31, 2013, Methods of Forming Reverse Side Engineered III-Nitride Devices.
U.S. Appl. No. 12/465,968, filed May 14, 2009, High Voltage III-Nitride Semiconductor Devices.
U.S. Appl. No. 13/748,907, filed Jan. 24, 2013, Semiconductor Devices with Field Plates.
U.S. Appl. No. 12/684,838, filed Jan. 8, 2010, Electronic Devices and Components for High Efficiency Power Circuits.
U.S. Appl. No. 14/058,089, filed Oct. 18, 2013, Semiconductor Electronic Components and Circuits.
U.S. Appl. No. 12/968,704, filed Dec. 15, 2010, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 13/019,733, filed Feb. 2, 2011, III-N Device Structures and Methods.
U.S. Appl. No. 14/102,750, filed Dec. 11, 2013, III-N Device Structures and Methods.
U.S. Appl. No. 13/040,524, filed Mar. 4, 2011, Semiconductor Diodes with Low Reverse Bias Currents.
U.S. Appl. No. 13/040,940, filed Mar. 4, 2011, Electrode Configurations for Semiconductor Devices.
U.S. Appl. No. 61/447,519, filed Feb. 28, 2011, Electronic Components with Reactive Filters.
U.S. Appl. No. 13/403,813, filed Feb. 23, 2012, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 13/405,041, filed Feb. 24, 2012, Semiconductor Power Modules and Devices.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 61/791,395, filed Mar. 15, 2013, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 61/844,260, filed Jul. 9, 2013, Multilevel Inverters and their Components.
U.S. Appl. No. 61/856,573, filed Jul. 19, 2013, III-Nitride Transistor Including a P-Type Depleting Layer.
U.S. Appl. No. 13/231,308, filed Sep. 13, 2011, III-N Device Structures Having a Non-Insulating Substrate.
U.S. Appl. No. 14/068,944, filed Oct. 31, 2013, High Power Semiconductor Electronic Components with Increased Reliability.
U.S. Appl. No. 13/535,094, filed Jun. 27, 2012, Semiconductor Devices with Integrated Hole Collectors.
U.S. Appl. No. 13/550,445, filed Jul. 16, 2012, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.

\* cited by examiner

US 8,772,842 B2

SEMICONDUCTOR DIODES WITH LOW REVERSE BIAS CURRENTS

TECHNICAL FIELD

This invention relates to semiconductor electronic devices, specifically diodes based on semiconductor heterojunctions.

BACKGROUND

Diodes are used in a wide range of electronic circuits. Diodes used in circuits for high voltage switching applications ideally require the following characteristics. When biased in the reverse direction (i.e., the cathode is at a higher voltage than the anode), the diode should be able to support a large voltage while allowing as little current as possible to pass through. The amount of voltage that must be supported depends on the application; for example, many high power switching applications require diodes that can support a reverse bias of at least 600V or at least 1200V without passing a substantial amount of current. When current flows through the diode in the forward direction (from anode to cathode), the forward voltage drop across the diode $V_{on}$ should be as small as possible to minimize conduction losses, or in other words the diode's on-resistance $R_{on}$ should be as small as possible. Finally, the amount of charge stored in the diode when it is reverse biased should be as small as possible to reduce transient currents in the circuit when the voltage across the diode changes, since reduced transient currents result in reduced switching losses.

In diodes, there is typically a trade-off between the various characteristics described above. For example, silicon Schottky diodes can typically exhibit excellent switching speed and on-state performance, but suffer from large reverse leakage currents, making them unsuitable for high voltage applications. Conversely, high voltage Si PIN diodes can support large reverse bias voltages with low leakage, but typically exhibit high conduction and switching losses. Further, reverse recovery currents in PIN diodes add to these losses when the PIN diodes are incorporated into circuits.

FIG. 1 shows a cross-sectional view of a prior art III-N semiconductor heterostructure diode. As used herein, the terms III-N or III-Nitride materials, layers, devices, etc., refer to a material or device comprised of a compound semiconductor material according to the stoichiometric formula $Al_xIn_yGa_zN$, where x+y+z is about 1. The diode structure includes a substrate 20, a first III-N semiconductor layer 22 on top of the substrate, and a second III-N semiconductor layer 24 on top of the first III-N layer. III-N layers 22 and 24 have different compositions from one another, the compositions selected such that a two-dimensional electron gas (2DEG) 26 (illustrated by a dashed line) is induced in the first III-N layer 22 near the interface between the first and second III-N layers 22 and 24. An anode contact 27 (or a plurality of anode contacts, not shown) are formed on top of surface 25 of the second III-N layer 24, and a single cathode contact 28 is formed which contacts the 2DEG 26. The anode contact 27 is a Schottky contact, and the single cathode contact 28 is an ohmic contact.

Anode and cathode contacts 27 and 28, respectively, may be any arbitrary shape, although the shape can be optimized to minimize the on-resistance $R_{on}$ of the device. Further, the choice of metals for the contacts, especially that of the anode contact 27, can affect the forward operating voltage $V_{on}$ (also known as the on-voltage) of the device. It is desirable to provide diodes for which high blocking voltages and low reverse leakage currents can be achieved while at the same time maintaining lower on-resistance and control of the forward operating voltage. Diode structures which can easily be integrated with other circuit components, such as transistors, are desirable for process integration and cost reduction.

SUMMARY

In one aspect, a diode is described that includes a III-N material structure, an electrically conductive channel in the III-N material structure, two terminals, and a dielectric layer. The first terminal is an anode adjacent to the III-N material structure, and the second terminal is a cathode in ohmic contact with the electrically conductive channel. The dielectric layer is over at least a portion of the anode. The anode comprises a first metal layer adjacent to the III-N material structure, a second metal layer, and an intermediary electrically conductive structure between the first metal layer and the second metal layer, the intermediary electrically conductive structure reducing a shift in an on-voltage or reducing a shift in reverse bias current of the diode resulting from the inclusion of the dielectric layer.

In another aspect, a diode having a threshold voltage is described. The diode includes a III-N material structure, an anode and a cathode on the III-N material structure, and a dielectric encapsulation layer over at least a portion of the anode. A reverse bias current of the diode per unit width of the anode is less than 1 microamp/mm during reverse bias operation.

In yet another aspect, a diode is described that includes a III-N material structure, an electrically conductive channel in the III-N material structure, two terminals, and a dielectric encapsulation layer. The first terminal is an anode adjacent to the III-N material structure, and the second terminal is a cathode in ohmic contact with the electrically conductive channel. The dielectric encapsulation layer is over at least a portion of the anode, a portion of the cathode, and a surface of the III-N material structure between the anode and the cathode. The dielectric encapsulation layer protects the diode from contaminants in the surrounding environment. A shift in an on-voltage of the diode resulting from inclusion of the dielectric encapsulation layer is less than 0.1V.

In still another aspect, a diode is described that includes a III-N material structure, an electrically conductive channel in the III-N material structure, two terminals, and a dielectric encapsulation layer. The first terminal is an anode adjacent to the III-N material structure, and the second terminal is a cathode in ohmic contact with the electrically conductive channel. The dielectric encapsulation layer is over at least a portion of the anode, a portion of the cathode, and a surface of the III-N material structure between the anode and the cathode. The dielectric encapsulation layer serves to protect the diode from contaminants in the surrounding environment, and a reverse bias current of the diode is less than ten times that of a similar diode which lacks the dielectric encapsulation layer.

Implementations may include one or more of the following features. The III-N material structure can include a first III-N material layer and a second III-N material layer, and the electrically conductive channel can be a 2DEG channel induced in a region of the first III-N material layer adjacent the second III-N material layer as a result of a compositional difference between the first III-N material layer and the second III-N material layer. The first III-N material layer can be GaN. The second III-N material layer can be AlGaN or AlInGaN. The diode can include a third III-N material layer between the first III-N material layer and the second III-N material layer. The third III-N material layer can be AlN. The first III-N material layer and the second III-N material layer can be group III-face or [0 0 0 1] oriented or group-III terminated semipolar layers, and the second III-N material layer can be between the first III-N material layer and the dielectric layer. The first III-N material layer and the second III-N material layer can be N-face or [0 0 0 1bar] oriented or nitrogen-terminated semipolar layers, and the first III-N material layer can be between the second III-N material layer and the dielectric layer. The diode can include a recess in the III-N material structure, wherein at least a portion of the anode is in the recess. The recess can extend through the 2DEG channel. The recess can extend at least 30 nanometers into the III-N material structure. The diode can include an electrode-defining layer which is on a side of the recess and is between the III-N material structure and the dielectric layer. The electrode-defining layer can be SiN. The diode can include a dielectric passivation layer between the III-N material structure and the electrode-defining layer, the dielectric passivation layer contacting a surface of the III-N material structure between the anode and the cathode. The dielectric passivation layer can be SiN. The diode can include an additional insulating layer between the dielectric passivation layer and the electrode-defining layer. The additional insulating layer can be AlN. The additional insulating layer can be less than about 20 nanometers thick. The anode can include an extending portion which is over a surface of the electrode-defining layer. The recess in the electrode-defining layer can include a step, and the anode is over the step. The extending portion of the anode can function as a field plate. The diode can include a field plate connected to the anode. The dielectric layer can be $SiN_x$. The dielectric layer can be between about 0.2 microns and 20 microns thick. The dielectric layer can include a first dielectric layer and a second dielectric layer on a side of the first dielectric layer opposite the III-N material structure. The second dielectric layer can be $SiO_yN_z$. The diode can include a dielectric passivation layer between the III-N material structure and the dielectric layer, the dielectric passivation layer contacting a surface of the III-N material structure between the anode and the cathode. The dielectric passivation layer can be SiN. The diode can include an additional insulating layer between the dielectric layer and the dielectric passivation layer. The additional insulating layer can be AlN. There can be a shift in the on-voltage of the diode resulting from inclusion of the dielectric layer, and the shift can be to a lower on-voltage. The intermediary electrically conductive structure can result in reduced reverse bias current in the diode compared to a similar diode lacking the intermediary electrically conductive structure. The first metal layer can include a material selected from the group consisting of nickel, platinum, titanium, and tungsten. The first metal layer can be nickel and the second metal layer can be gold. The intermediary electrically conductive structure can include a metal layer. The intermediary electrically conductive structure can include a stack of at least two metals. Each of the at least two metals can be selected from the group consisting of titanium, nickel, and gold. The stack can consist of a layer of gold, a layer of nickel, and a layer of titanium, wherein the layer of gold is adjacent to the first metal layer and the layer of titanium is adjacent to the second metal layer. The diode can include an electrode-defining layer between the III-N material structure and the dielectric layer, wherein the electrode-defining layer includes an aperture with at least a portion of the anode in the aperture. The electrode-defining layer can be $SiN_x$. The anode can include a portion extending over a surface of the electrode-defining layer. The aperture in the electrode-defining layer can include a step, and the anode is over the step. The portion of the anode extending over the surface of the electrode-defining layer can function as a field plate. The diode can be a high-voltage device. The threshold voltage of the diode can be about 0.7V or less, or about 0.55V or less. A voltage across the diode can be about 1.25V or less, or about 1.1V or less, for a forward bias current per unit width of the anode of about 50 mA/mm. The reverse bias current of the diode per unit width of the anode can be about 0.1 microamps/mm or less during reverse bias operation. A reverse bias current of the diode can be less than ten times that of a similar diode which lacks the dielectric encapsulation layer. An increase in reverse bias current of the diode per unit width of the anode resulting from inclusion of the dielectric encapsulation layer can be less than 0.9 microamps/mm.

Diodes with low on-resistance and high breakdown voltage are described. The techniques and structures described here may result in superior control of shifts in the on-voltage of the device, as well as reduced reverse leakage. The details of one or more implementations of the invention are set forth in the accompanying drawings and description below. Other features and advantages of the invention will be apparent from the description and drawings, and from the claims.

DESCRIPTION OF DRAWINGS

Like reference symbols in the various drawings indicate like elements.

DETAILED DESCRIPTION

Diodes based on III-N heterostructures that can support high reverse-bias voltages with low reverse leakage, and at the same time exhibit low on-resistance, are described. The III-N diodes described herein can be high-voltage devices suitable for high voltage applications. That is, when they are reverse biased, they are at least capable of supporting all voltages less than or equal to the high-voltage in the application in which they are used, which for example may be 100V, 300V, 600V, 1200V, or 1700V. When they are forward biased, they are able to conduct substantial current with a low on-voltage. The maximum allowable value of the on-voltage is the maximum voltage that can be sustained in the application in which the diodes are used. The III-N diodes each include a dielectric layer over the surface of the diode that serves to encapsulate the device in order to protect it from contaminants and prevent other adverse effects, such as variations in output characteristics due to changes in humidity or other environmental factors. While the dielectric layer improves device reliability, it can also result in shifts in the device's on-voltage as well as increased reverse leakage, possibly caused by additional stress induced in the anode contact of the diode. These deleterious effects can be mitigated by including an intermediary electrically conductive structure in the anode contact, or by choosing a material for the dielectric layer that provides sufficient protection to the device without substantially shifting the on-voltage or increasing reverse leakage.

Figure 2:
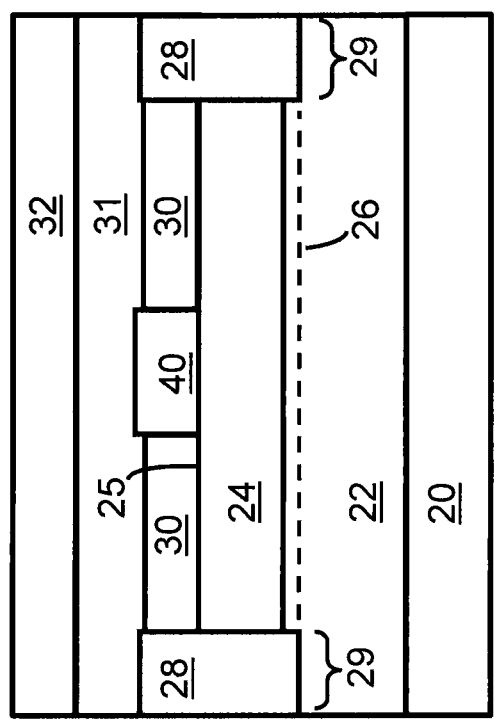
FIG. 2 is a cross-sectional view of one implementation of a III-N diode.

As shown in FIG. 2, the illustrated III-N diode includes a substrate 20, a first III-N layer 22 on top of the substrate, and a second III-N layer 24 on top of the first III-N layer. III-N layers 22 and 24 have different compositions from one another, the compositions selected such that a two-dimensional electron gas (2DEG) 26 (illustrated by a dashed line), i.e., a conductive channel, is induced in the first III-N layer 22 near the interface between the first and second III-N layers 22 and 24. An anode contact 40, or a plurality of such contacts (only one is shown in FIG. 2) are formed on top of surface 25 of the second III-N layer 24. A single cathode contact 28 is formed which contacts the 2DEG 26 and is in close proximity to at least a portion of anode contact 40. The anode contact 40 is a Schottky contact, and the single cathode contact 28 is an ohmic contact.

As used herein, the term "single cathode contact" refers to either a single metallic contact which serves as a cathode, or to a plurality of contacts serving as cathodes which are electrically connected such that the electric potential at each contact is about the same, or is intended to be the same, during device operation. In the cross-sectional view of FIG. 2, while there appear to be two cathode contacts, the two contacts are in fact electrically connected so as to form a single cathode contact 28. As used herein, two or more contacts or other elements are said to be "electrically connected" if they are connected by a material which is sufficiently conducting to ensure that the electric potential at each of the contacts or other elements is about the same, or is intended to be the same, at all times during operation.

The anode contact 40 in FIG. 2 has a different metal layer structure than the anode contact 27 in FIG. 1, as will be described below. The diode further includes a dielectric layer 31 over the surface of the device that serves as an encapsulation layer to protect the device from contaminants and prevent other adverse effects, such as variations in output characteristics due to changes in humidity or other environmental factors. The diode may also optionally include a passivation layer 30 which contacts the III-N material surface at least between the anode and cathode contacts 40 and 28, respectively, or an additional dielectric layer 32 over the dielectric layer 31, or both. The device may also include additional III-N layers (not shown), for example a III-N buffer layer between the first III-N layer 22 and the substrate 20, or a III-N layer such as AlN between the first III-N layer 22 and the second III-N layer 24.

The diode in FIG. 2 operates as follows. When the voltage at the anode contact 40 is less than that at the cathode contact 28, such that the Schottky junction between anode contact 40 and III-V layer 24 is reverse biased, the diode is in the OFF state with only a small reverse bias current flowing between the anode and cathode. Ideally, the reverse bias current is as small as possible. When the voltage at the anode contact 40 is greater than that at the cathode contact 28, the Schottky junction between anode contact 40 and III-V layer 24 is forward biased, and the diode is in the ON state. In this state, a substantial electron current flows from the cathode contact 28 predominantly through the 2DEG 26 and then through the forward biased Schottky junction into the anode contact 40. That is, at least 99% of the total forward bias current flows from the anode to the cathode through the Schottky barrier and through the 2DEG channel. A small amount of leakage current can flow through other paths, such as along the surface of the device.

As stated earlier, III-N layers 22 and 24 have different compositions from one another. The compositions are selected such that the second III-N layer 24 has a larger bandgap than the first III-N layer 22, which helps enable the formation of 2DEG 26. If III-N layers 22 and 24 are composed of III-N material oriented in a non-polar or semi-polar orientation, then doping all or part of the second semiconductor layer 24 with an n-type impurity may also be required to induce the 2DEG 26. If the III-N layers 22 and 24 are oriented in a polar direction, such as the [0 0 0 1] (i.e., group III-face) orientation, then 2DEG 26 may be induced by the polarization fields without the need for any substantial doping of either of the III-N layers, although the 2DEG sheet charge concentration can be increased by doping all or part of the second III-N layer 24 with an n-type impurity. Increased 2DEG sheet charge concentrations can be beneficial in that they can reduce the diode on-resistance, but they can also lead to lower reverse breakdown voltages. Hence the 2DEG sheet charge concentration must be optimized to a suitable value for the application in which the diode is used.

III-N materials can be used for layers 22 and 24, wherein the compositions of the layers are chosen such that the requirements for layers 22 and 24 are satisfied. As an example, III-N layer 22 can be GaN and III-N layer 24 AlGaN or AlInGaN, whereas layer 24 can be n-doped or can contain no significant concentration of doping impurities. In the case that layer 24 is undoped, the induced 2DEG results from the difference in polarization fields between layers 22 and 24. The III-N material configurations for the diode described above can also be used in a III-N HEMT device. Hence, the diodes described herein can be integrated with III-N HEMT devices onto a single chip, thereby simplifying the fabrication process and reducing cost.

Substrate 20 can be any suitable substrate upon which III-N layers 22 and 24 can be formed, for example silicon carbide (SiC), silicon, sapphire, GaN, AlN, or any other suitable substrate upon which III-N devices can be formed. In some implementations, a III-N buffer layer (not shown) such as AlGaN or AlN is included between substrate 20 and semiconductor layer 22 to minimize material defects in layers 22 and 24.

As previously mentioned, the device of FIG. 2 also includes a dielectric layer 31, and optionally an insulating layer 30 and a second dielectric layer 32. Insulating layer 30, formed of an insulating dielectric material such as a layer of SiN, atop the second III-N layer 24, maintains effective passivation of the uppermost III-N surface of the device, i.e., the surface 25 of the second III-N layer 24. As used herein, a "passivation layer" refers to any layer or combination of layers grown or deposited on a surface of a semiconductor layer in a semiconductor device which can prevent or suppress voltage fluctuations at the surface during device operation. For example, a passivation layer may prevent or suppress the formation of surface/interface states at the uppermost III-N surface, or it may prevent or suppress the ability of surface/interface states to trap charge during device operation. In some implementations, insulating layer 30 is omitted, and dielectric layer 31 maintains effective passivation of the uppermost III-N surface of the device.

Dielectric layer 31 is deposited on top of insulating layer 30, cathode contact 28, and anode contact 40, encapsulating the uppermost surface of the device. As such, dielectric layer 31 is over at least a portion of the anode contact 40. Dielectric layer 31 is formed of a dielectric material, such as silicon nitride, aluminum nitride, silicon oxide, alumina, a polymeric dielectric, an inorganic or organic dielectric, or any combination of these dielectric materials. Dielectric layer 31 can be grown or deposited by methods such as chemical vapor deposition (CVD), plasma-enhanced chemical vapor deposition (PECVD), atomic layer deposition (ALD), sputtering, spinning, or other method. Dielectric layer 31 protects the device during operation, preventing or suppressing effects such as dispersion and arcing, as well as protecting the device from environmental factors such as humidity.

Dispersion refers to a difference in observed current-voltage (I-V) characteristics when the device is operated under RF or switching conditions as compared to when the device is operated under DC conditions. In III-N devices, effects such as dispersion are often caused by voltage fluctuations at uppermost III-N surfaces, often caused by the charging of surface states during device operation. Dielectric layer 31 can be sufficiently thick to protect the device from these effects. Accordingly, the thickness of dielectric layer 31 can be about 0.2 microns or thicker, such as between about 0.2 microns and 2 microns, or between about 0.2 microns and 10 microns, or between about 0.2 microns and 20 microns. When insulating layer 30 is included, dielectric layer 31 in combination with insulating layer 30 maintains effective passivation of the uppermost III-N surface of the device. In some implementations, an additional insulating layer (not shown), such as AlN is included between the insulating layer 30 and the dielectric layer 31. In this case, the additional insulating layer may need to be made thin enough, such as thinner than about 20 nm, thinner than about 10 nm, or thinner than about 5 nm, to ensure that effective passivation of the uppermost III-N surface is still maintained. Too thick an additional insulating layer, such as greater than about 20 nm, can degrade the passivation effects of layers 30 and 31.

Anode contact 40, formed upon surface 25 of semiconductor layer 24, forms a Schottky contact to layer 24. Cathode contact 28 contacts the 2DEG in ohmic region 29, forming a contact which is a substantially ohmic contact. Cathode contact 28 can be made to contact the 2DEG in a number of ways. For example, a metal or combination of metals can be deposited in ohmic region 29 upon the surface of layer 24, followed by a thermal anneal which results in the deposited metal forming a metallic alloy with the underlying semiconductor material. Other methods by which the 2DEG can be contacted include, but are not limited to, ion implantation of n-type dopants into ohmic region 29, followed by a metal deposition atop this region, or by etching away the material in ohmic region 29 and regrowing n-type material, followed by a metal deposition atop this region. Anode contact 40 and cathode contact 28 may be any arbitrary shape, although the shape is ideally optimized to minimize the device area required for a given forward current.

Figure 3:
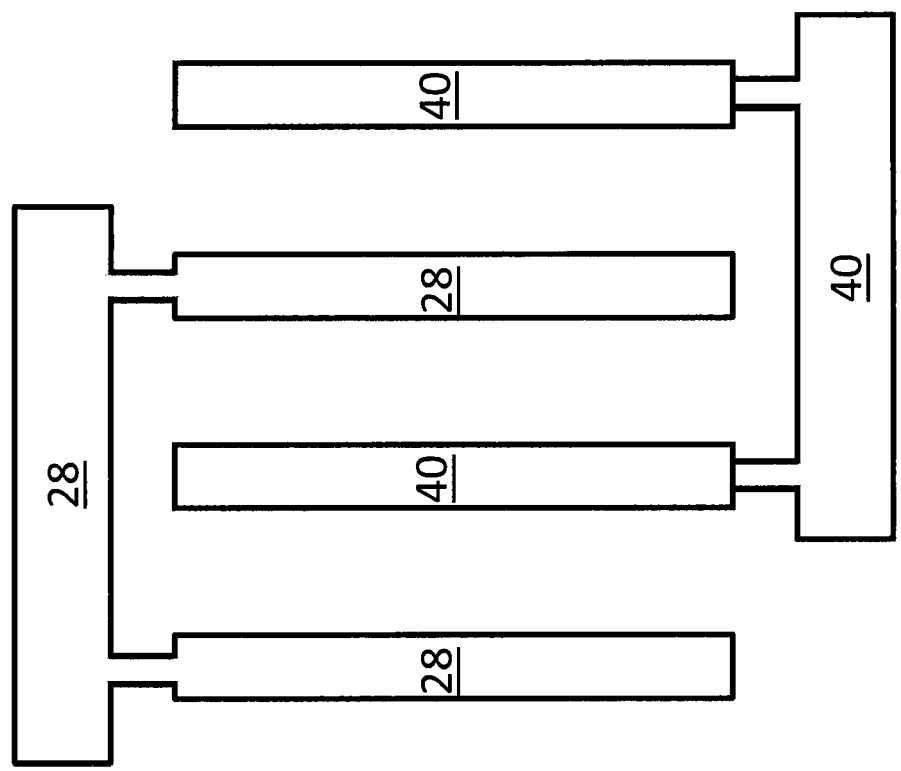
FIG. 3 is a plan view of the electrode layout of a III-N diode.

FIG. 3 is a plan view (top view) of an electrode configuration that may be used in the device of FIG. 2, and includes alternating "fingers" of cathode contact 28 and anode contact 40, connected to cathode and anode contact pads shown on the top and bottom, respectively, of FIG. 3. Additional cathode and anode fingers can be included with those shown in FIG. 3.

Figure 1:
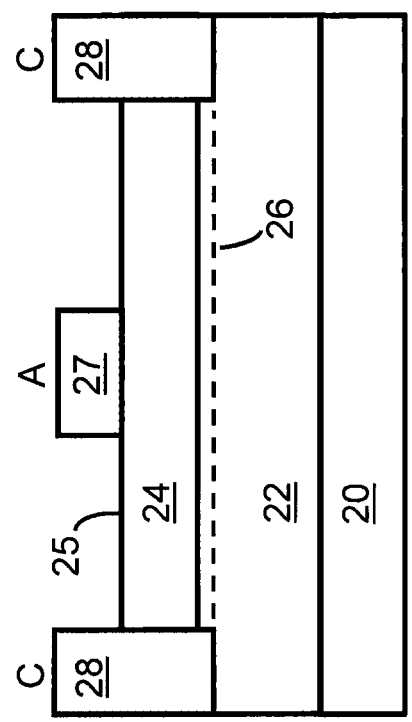
FIG. 1 is a cross-sectional view of a diode device of the prior art.

Conventional anode contacts, such as anode 27 in the structure of FIG. 1, typically include two metal layers. The first metal layer, which contacts the underlying III-N materials, forms a Schottky contact with the III-N materials. Preferably, the Schottky barrier height is as large as possible in order to minimize reverse bias currents. A layer of nickel is commonly used for the first contacting metal layer. The second metal layer, which is atop the first metal layer opposite the III-N materials, is typically thick and has a large electrical conductivity, in order to reduce lateral resistances in the anode contact.

Figure 4:
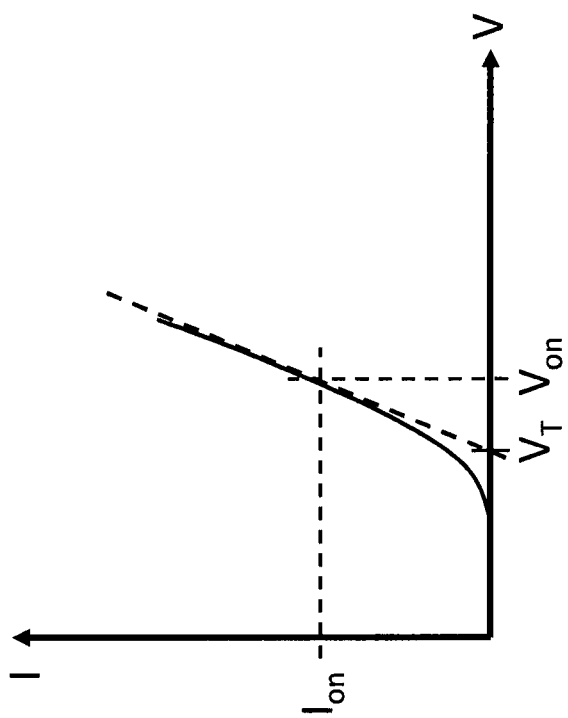
FIG. 4 is a representative plot of current versus voltage for a III-N diode.

Referring again to FIG. 2, it has been found that after the deposition of dielectric layer 31 over the surface of a III-N diode device, the forward operating voltage $V_{on}$ of the device shifts to a lower value. For a given diode, the $V_{on}$ of the device is defined for a specific current density $I_{on}$, as illustrated in FIG. 4. It is conventional in the art for $V_{on}$ to be defined as the voltage across the device terminals at a current density $I_{on}$ of 50 mA/mm. The diode also has a threshold voltage $V_T$, also illustrated in FIG. 4. $V_T$ is found by fitting a straight line to the linear portion of the I-V characteristics, and then extending the line to the voltage axis, as shown. $V_T$ is the point at which the extended line intersects the voltage axis. Shifts in $V_{on}$ are accompanied by equal shifts in $V_T$. That is, for a shift of X volts in $V_{on}$, $V_T$ also shifts by X volts.

The reduction in $V_{on}$ and $V_T$ after deposition of dielectric layer 31 is accompanied by an increase in the reverse bias current (or similarly the reverse current density or reverse current) in the device, indicating that the effective Schottky barrier height between the anode contact and the adjacent III-N material is being reduced, possibly as a result of stress induced by the dielectric layer 31 in the portion of the anode contact that contacts the III-N material.

Figure 5:
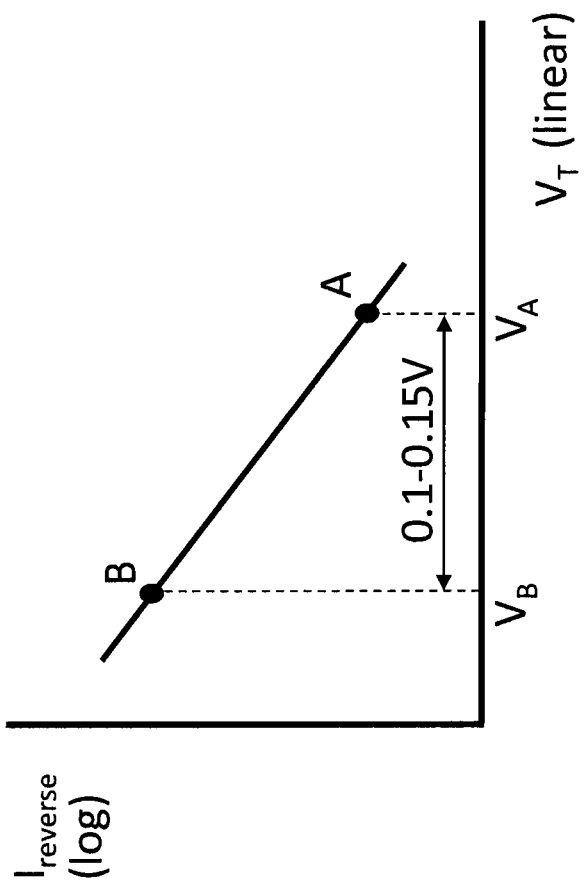
FIG. 5 is a representative plot of reverse current as a function of threshold voltage for a III-N diode.

FIG. 5 shows a representative plot of the reverse current density ($I_{reverse}$), which is the current density that flows through the device while the device is in the OFF state, as a function of the threshold voltage $V_T$ of the device of FIG. 1 for a given material structure of anode contact 27. Point A on the plot corresponds to a device that does not include dielectric insulating layer 31, as in FIG. 1. The $V_T$ at point A can be between about 0.7 Volts and 0.75 Volts, corresponding to a Von between about 1.05 Volts and 1.25 Volts, and the $I_{reverse}$ can be about 0.1 microamps/mm (μA/mm), when the portion of anode contact 27 adjacent to the III-N device layers is nickel. When a dielectric layer 31, such as SiN, is deposited over the device, covering at least a portion of the anode contact, the on-voltage shifts to a lower value, and the reverse bias current becomes correspondingly larger. Point B in the plot of FIG. 5 corresponds to the device of FIG. 1 after deposition of a dielectric layer, such as dielectric layer 31 from FIG. 2, over the device of FIG. 1.

When the portion of anode contact 27 adjacent to the III-N device layers is nickel, the $V_T$ at point B can be between about 0.55 Volts and 0.6 Volts, corresponding to a $V_{on}$ between about 0.9 Volts and 1.1 Volts, and the $I_{reverse}$ can be as high as 1 μA/mm, which is ten times the value of $I_{reverse}$ prior to deposition of dielectric layer 31. Therefore, the inclusion of dielectric layer 31 results in a reduction of $V_T$ and $V_{on}$ of the device by about 0.1 to 0.15 Volts. It has further been found that when the portion of anode contact 27 adjacent to the III-N device layers is nickel and the dielectric layer 31 is SiN, the thickness of dielectric layer 31 has little or no effect on the magnitude of the shift in $V_T$ or $V_{on}$, i.e., a shift of about 0.1 to 0.15 Volts has been observed for all devices that include a SiN dielectric layer 31 which is at least about 3500 Angstroms thick. Therefore it is desirable that dielectric layer 31 be thicker in order to most effectively protect the device as well as prevent dispersion and other deleterious effects as described above.

Further, the thickness of dielectric layer 31 can be chosen so that it is possible to fabricate the device such that its electrodes, which are under dielectric layer 31, may be accessed. For example, the electrodes may be accessed by etching through a portion of dielectric layer 31. If dielectric layer 31 is too thick, it may be difficult or not possible to etch the entire thickness of dielectric layer 31 and to access the electrodes. If dielectric layer 31 is too thick, the layer may cause substantial stress in the III-N layers which can lead to cracking of the III-N layers or result in undesirable device performance. Accordingly, dielectric layer 31 can be between about 0.2 microns and 20 microns thick, as stated above.

It has been found that the inclusion of additional intermediary electrically conductive layers in the anode contact 40, as compared to the metal layers used in the anode contacts of conventional III-N devices such as that of FIG. 1, can serve to control shifts in the forward operating voltage $V_{on}$, and equivalently in the threshold voltage $V_T$, of the device. As previously discussed, conventional anode electrodes, such as anode 27 in the structure of FIG. 1, typically include two metal layers. Commonly used metals are nickel (Ni), platinum (Pt), titanium (Ti), or tungsten (W) for the first metal layer, and a thicker second metal on top of the first metal layer, such as gold (Au).

Figure 6:
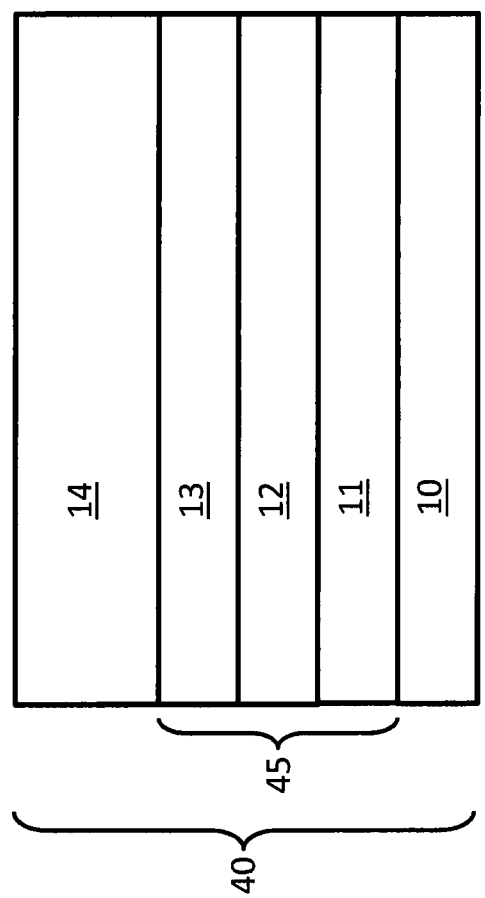
FIG. 6 is a cross-sectional view of the layer structure of an anode electrode in a III-N diode.

FIG. 6 shows a schematic illustration of the metal layer structure of anode contact 40 in the device of FIG. 2. The layer structure of anode 40 includes an additional intermediary electrically conductive structure 45 as compared to the conventional anode contact 27 of FIG. 1. The layer structure of anode contact 40 includes a first metal layer 10, such as Ni, which can be about 600 Angstroms thick, a second metal layer 14, such as Au, which can be between about 2 and 3 microns thick, and an intermediary electrically conductive structure 45 between the first metal layer 10 and the second metal layer 14. Intermediary electrically conductive structure 45 includes at least one electrically conductive layer, which for example can be titanium (Ti), platinum (Pt), tungsten (W), aluminum (Al), chromium (Cr), NiCr, germanium (Ge), copper (Cu), nickel (Ni), gold (Au), or combinations therein. In the implementation shown in FIG. 6, the intermediary electrically conductive structure 45 includes three layers 11, 12, and 13. Layer 11 is Au and can be between about 3500 and 7500 Angstroms thick, layer 12 is Ni and can be about 300 Angstroms thick, and layer 13 is titanium (Ti) and can be about 300 Angstroms thick.

Figure 7:
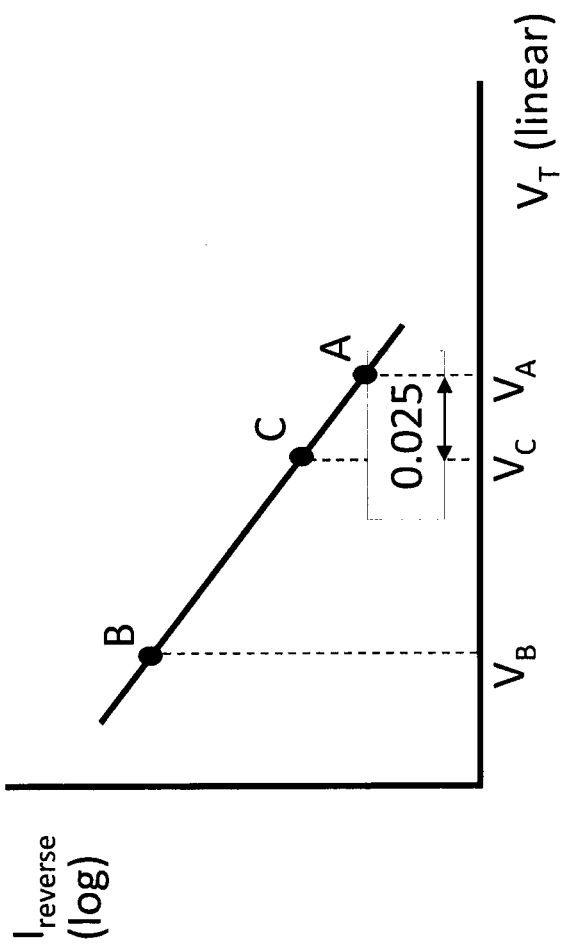
FIG. 7 is a representative plot of reverse current as a function of threshold voltage for a III-N diode.

It has been found that the inclusion of the intermediary electrically conductive structure 45 between the first and second metal layers 10 and 14 reduces the shift in the forward operating voltage $V_{on}$, the shift in the threshold voltage $V_T$, and the shift in reverse bias current $I_{reverse}$ of devices as compared to devices that do not include intermediary electrically conductive structure 45. This is illustrated in the representational plot of FIG. 7. FIG. 7 is the same as FIG. 5, but further includes a Point C corresponding to the threshold voltage $V_T$ and reverse bias current $I_{reverse}$ of the device of FIG. 2 after deposition of dielectric layer 31. Prior to deposition of dielectric layer 31, the threshold voltage $V_T$ and reverse bias current $I_{reverse}$ of the device of FIG. 2 is similar to that of FIG. 1 and is also represented by Point A in FIG. 7. The $V_T$ of the device of point A is between 0.7 Volts and 0.75 Volts, corresponding to a Von between about 1.05 Volts and 1.25 Volts. As seen in FIG. 7, the shift in the threshold voltage $V_T$ of the device of FIG. 2 after deposition of dielectric layer 31 and the inclusion of electrically conductive structure 45 in anode contact 40, where the thickness of layer 11 in electrically conductive structure 45 is 5000 Angstroms, is about 0.025V. This is about 4 times less than the shift in the device of FIG. 1. This fourfold reduction results from the inclusion of electrically conductive structure 45 in anode contact 4. Accordingly, the $V_T$ at Point C is between 0.675 Volts and 0.725 Volts, corresponding to a Von between about 1.025 Volts and 1.225 Volts, and the reverse current per unit anode width at Point C is less than 1 µA/mm, such as less than 0.6 µA/mm or less than 0.3 µA/mm. The $I_{reverse}$ at Point C can be less than 10 times the $I_{reverse}$ at Point A, such as less than 5 times or less than 3 times the $I_{reverse}$ at Point A.

When the structure shown in FIG. 6 is used for anode contact 40, where layer 11 is Au, layer 12 is Ni, and layer 13 is Ti, the shift in the forward voltage and the threshold voltage of the device can be controlled by varying the thickness of metal layer 11. For example, if metal layer 11 is thicker, the resulting shift in $V_{on}$ and $V_T$ is greater. Likewise, if metal layer 11 is thinner, the resulting shift in $V_{on}$ and $V_T$ is smaller. The reverse bias current $I_{reverse}$ is also reduced as a result of inclusion of electrically conductive structure 45. It is predicted that the shift in forward operating voltage and threshold voltage of the III-N diode device following deposition of dielectric layer 31, as shown in FIG. 5, is due to stress or strain in the anode contact caused by the dielectric layer 31, resulting in a reduction of the effective Schottky barrier height between the anode contact and the adjacent III-N material.

Referring again to FIG. 2, the second dielectric layer 32, which is optionally included, is formed of a dielectric material such as silicon oxy-nitride ($SiO_xN_y$), and can be grown or deposited using PECVD or another method listed above. The thickness of second dielectric layer 32 can be about 3 microns or thicker. Second dielectric layer 32 provides additional protection for the device during operation. In some cases, the second dielectric layer 32 is formed of a material that is more effective than dielectric layer 31 at preventing environmental factors such as humidity from affecting device performance, but would not alone serve as a suitable passivation layer without the inclusion of dielectric layer 31.

Figure 8:
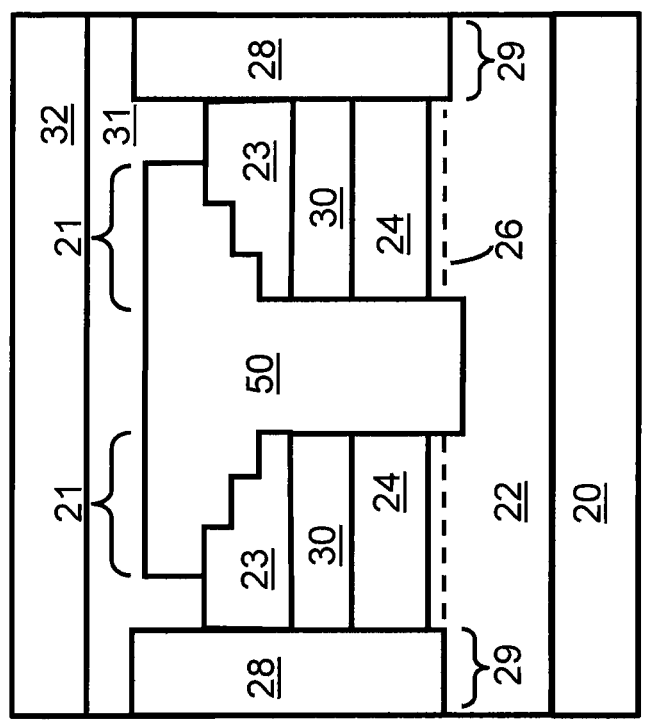
FIG. 8 is a cross-sectional view of another implementation of a III-N diode.

Another implementation is shown in FIG. 8. The device in FIG. 8 is similar to that of FIG. 2, but further includes an electrode-defining layer 23. A recess is included in the electrode-defining layer 23, the recess extending into the III-N materials at least through the 2DEG 26, and the anode contact 50 is in the recess. The diode also includes a field plate 21 connected to the anode contact 50. Electrode-defining layer 23 is an insulator, such as SiN, and serves to shape the field plate. The shape of the field plate is determined by the profile of the aperture through electrode-defining layer 23. Electrode-defining layer 23 also serves as a suitable passivation layer either on its own or in combination with passivation layer 30.

An additional insulating layer (not shown), such as AlN, may also be included between the electrode-defining layer 23 and the passivation layer 30. The additional insulating layer can aid in fabrication of the device by serving as an etch-stop layer. The material layer structure of the anode contact 50 is the same as that shown in FIG. 6 for anode contact 40 of FIG. 2. That is, anode contact 50 includes a first metal layer such as Ni adjacent to the III-N material structure, a second metal layer such as Au, and an intermediary electrically conductive structure between the first metal layer and the second metal layer serving to reduce the shift in on-voltage of the diode that results from deposition of the dielectric layer 31, as previously described.

The field plate 21 in this diode of FIG. 8 reduces the peak electric field at the edge of the anode, thereby increasing the reverse-bias breakdown voltage while having no substantial impact on the on-resistance or other on-state characteristics. In particular, slant field plates, such as those described in U.S. patent application Ser. No. 11/841,476, filed Aug. 20, 2007, and assigned to the same assignee as the described invention, are especially desirable. Or, as shown in FIG. 8, stepped field plate structures with at least one step, at least two steps, or at least three steps can be used. Additionally, multiple field plate structures can be used.

The depth of the recess containing anode contact 50 in FIG. 8 (that is, how deep below the 2DEG 26 the recess extends) can control or vary shifts in the threshold voltage $V_T$ and the forward operating voltage $V_{on}$, and correspondingly the reverse bias current $I_{reverse}$, of the device. This is because changing the depth of the aperture modifies the electric field profile in the III-N materials near the portion of 2DEG 26 which is modulated by the voltage on the anode contact 50. A deeper recess reduces the peak electric field in this region in much the same way as a conventional field plate, thereby leading to devices with higher threshold voltages $V_T$ and forward operating voltages $V_{on}$, but also lower reverse bias currents $I_{reverse}$, as well as higher reverse breakdown voltages.

Figure 9:
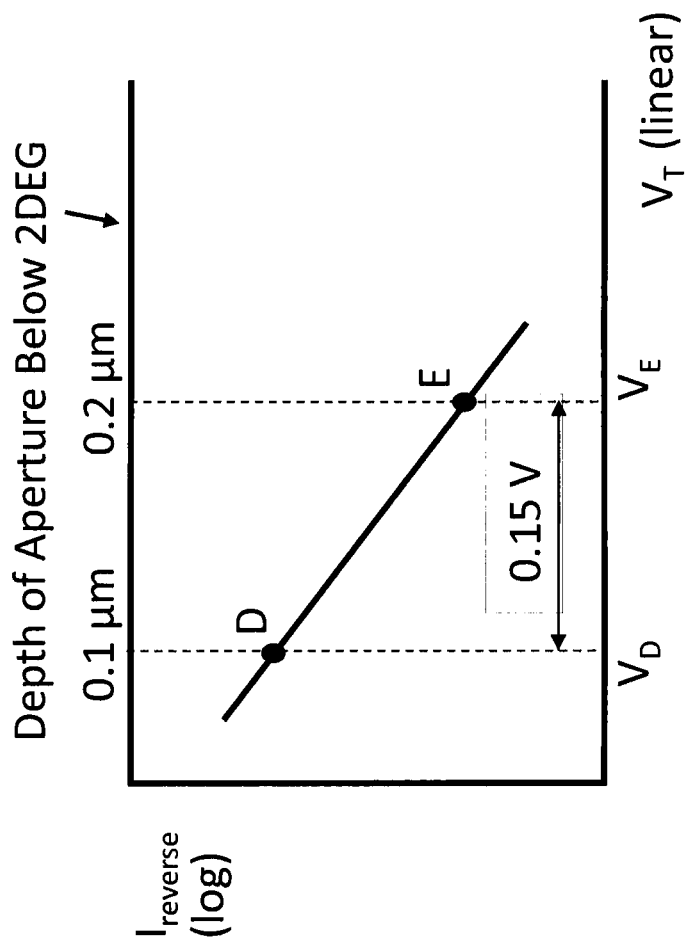
FIG. 9 is a representative plot of reverse current as a function of both threshold voltage and depth of the anode contact for a III-N diode.

FIG. 9 shows a representative plot of the reverse bias current ($I_{reverse}$) as a function of both the threshold voltage $V_T$ of the device (lower axis) and the depth of the aperture (upper axis), where the depth of the aperture is measured from the upper surface of the III-N materials to the bottom of the aperture. Point D in FIG. 9 corresponds to an aperture with a depth of 0.1 microns, while Point E corresponds to an aperture depth of 0.2 microns. For both the devices of points D and E, the thickness of the second III-N layer 24 (i.e., the approximate depth of the 2DEG 26 below the upper surface of the III-N materials) is 0.027 microns. As such, the depth of the recess can be at least 30 nm, at least 0.1 microns, or at least 0.2 microns in order for the recess to extend through the 2DEG 26. The threshold voltages $V_T$ at points D and E are 0.55 and 0.7 Volts, respectively, which corresponds to a shift in the threshold voltage $V_T$ and forward voltage $V_{on}$ of about 0.15 Volts from Point D to Point E. The reverse bias current per unit width of anode contact $I_{reverse}$ at points D and E is approximately 1 µA/mm and 0.1 µA/mm, respectively. Therefore the depth of the anode contact 50 can provide additional control of the forward operating voltage (and consequently the reverse bias current) of the device.

Figure 10:
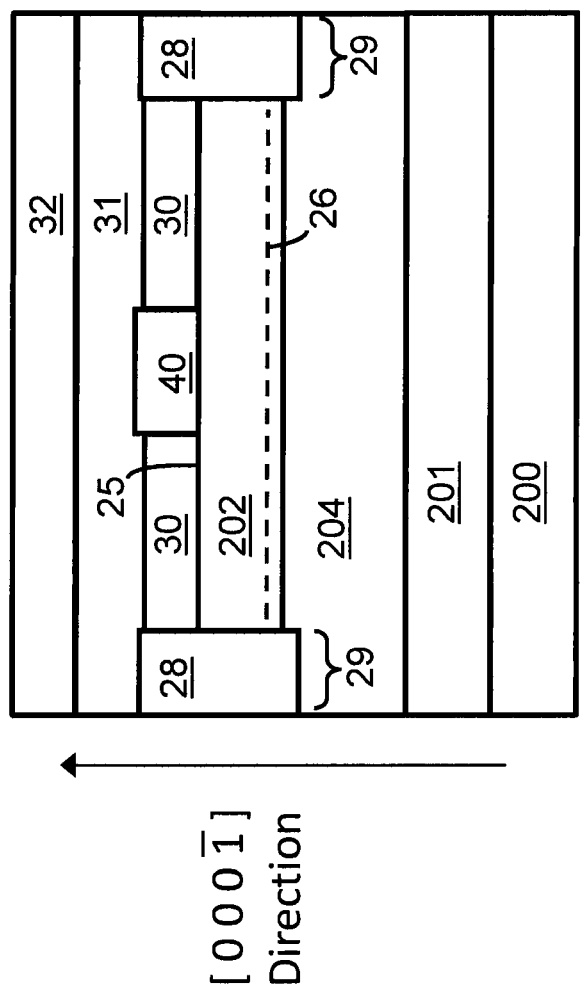
FIG. 10 is a cross-sectional view of another implementation of a III-N diode.
Figure 11:
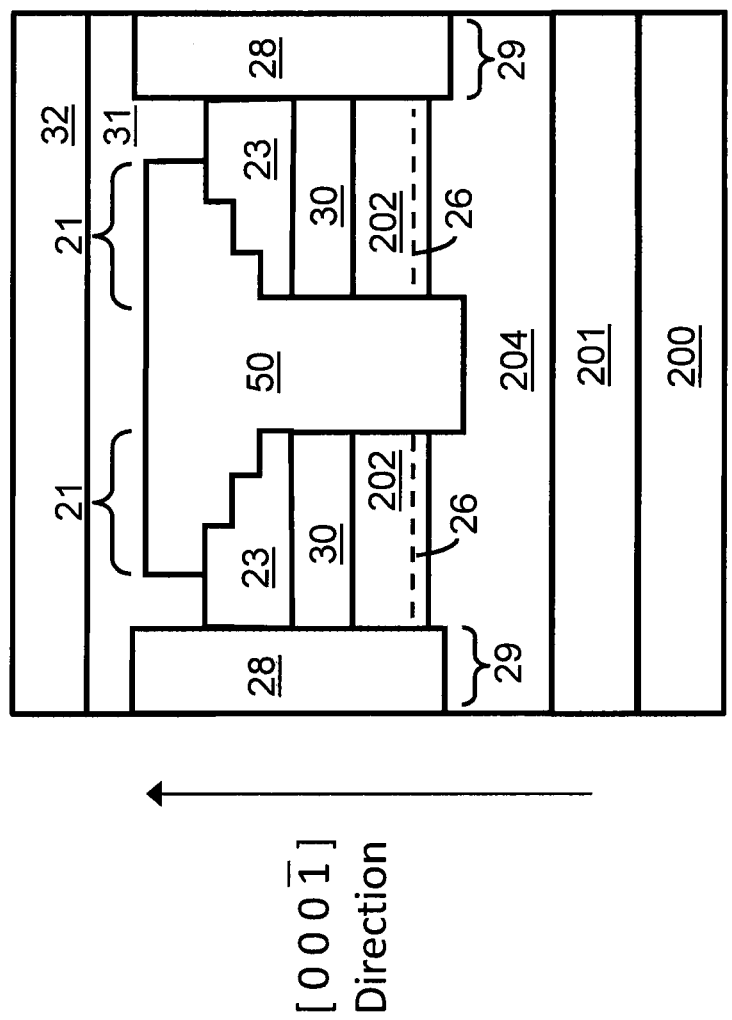
FIG. 11 is a cross-sectional view of another implementation of a III-N diode.
Figure 12:
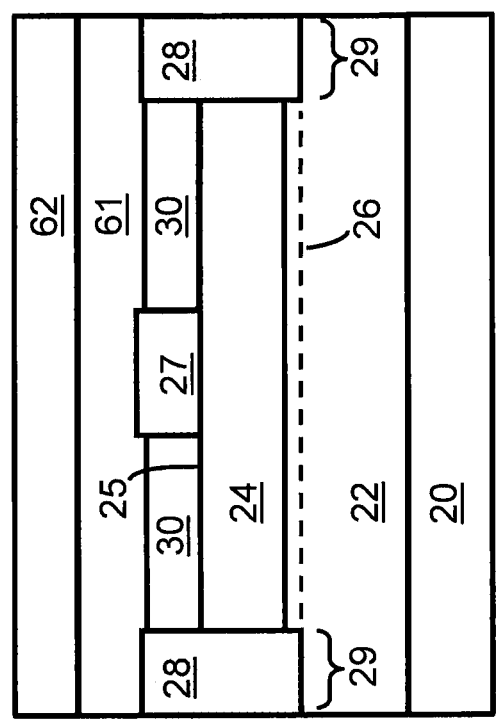
FIG. 12 is a cross-sectional view of another implementation of a III-N diode.

More implementations of the described devices are shown in FIGS. 10, 11 and 12. FIG. 10 shows a cross-sectional view of a diode similar to the device in FIG. 2, but which is fabricated on III-N semiconductor material that is either oriented in the N-polar [0 0 0 1bar] direction or is a nitrogen-terminated semipolar material. That is, the face of the III-N materials furthest from the substrate is either a [0 0 0 1bar] face or is a nitrogen-terminated semipolar face. The device includes a substrate 200 which is suitable for growth of N-polar or semipolar III-N materials. Layer 201 is a buffer layer, such as GaN or AlN, which reduces the defect density in the overlying III-N material. In some cases, it is possible to omit layer 201 and grow III-N layer 204 directly on the substrate 200. The composition of III-N layers 204 and 202 are chosen such that a 2DEG 26 can be induced in layer 202 near the interface between layers 202 and 204. For example, layer 204 can be AlGaN or AlInGaN, and layer 202 can be GaN. Anode contact 40 is formed on the surface of III-N layer 202 opposite the substrate 200, and a single cathode contact 28 is formed which contacts the 2DEG 26 and is in close proximity to at least a portion of anode contact 40. The anode contact 40 is a Schottky contact, and the single cathode contact 28 is an ohmic contact. As with previous implementations, the layer structure of the anode contact 40 is similar to or the same as that shown in FIG. 6 and includes an intermediary electrically conductive structure between a first metal layer and a second metal layer, the intermediary electrically conductive structure serving to reduce a shift in the on-voltage and threshold voltage of the diode resulting from inclusion of dielectric layer 31 over the device. Also as with previous implementations, the device of FIG. 10 can optionally include a passivation layer 30 and/or an additional dielectric layer 32 over dielectric layer 31.

FIG. 11 shows a cross-sectional view of a diode similar to the device of FIG. 8, but which is fabricated on III-N semiconductor material that is either oriented in the N-polar [0 0 0 1bar] direction or is a nitrogen-terminated semipolar material. The device includes a substrate 200 which is suitable for growth of N-polar or semipolar III-N materials. Layer 201 is a buffer layer, such as GaN or AlN, which reduces the defect density in the overlying III-N material. In some cases, it is possible to omit layer 201 and grow III-N layer 204 directly on the substrate. The composition of III-N layers 204 and 202 are chosen such that a 2DEG 26 can be induced in layer 202 near the interface between layers 202 and 204. For example, layer 204 can be AlGaN or AlInGaN, and layer 202 can be GaN. The device also includes an electrode-defining layer 23.

A recess is included in the electrode-defining layer 23, the recess extending into the III-N materials at least through the 2DEG 26, and the anode contact 50 is in the recess. The diode also includes a field plate 21 connected to the anode contact 50. Electrode-defining layer 23 in FIG. 8 is an insulator, such as SiN, and serves to shape the field plate. The shape of the field plate is determined by the profile of the aperture through electrode-defining layer 23. Electrode-defining layer 23 also serves as a suitable passivation layer either on its own or, when passivation layer 30 is included, in combination with passivation layer 30. An additional insulating layer (not shown), such as a layer of AlN, may also be included between the electrode-defining layer 23 and the passivation layer 30. The additional layer can aid in fabrication of the device by serving as an etch-stop layer. The material layer structure of the anode contact 50 is the same as that shown in FIG. 6 for anode contact 40 of FIG. 2. That is, anode contact 50 includes a first metal layer such as Ni adjacent to the III-N material structure, a second metal layer such as Au, and an intermediary electrically conductive structure between the first metal layer and the second metal layer serving to reduce the shift in the on-voltage and threshold voltage of the diode that results from deposition of the dielectric layer 31, as previously described.

The diode of FIG. 12 is similar to that shown in FIG. 1, but further includes a dielectric encapsulation layer 61 and optionally an additional dielectric layer 62. Dielectric encapsulation layer 61 differs from dielectric layer 31 in FIG. 2 in that it does not cause as large a reduction in the on-voltage, or correspondingly as large an increase in the reverse bias current, of the device as compared to dielectric layer 31. For example, the shift in the on-voltage of the diode resulting from inclusion of the dielectric encapsulation layer 61 can be less than 0.1V, less than 0.08V, less than 0.06V, or less than 0.05V. The increase in the reverse bias current of the diode per unit width of the anode contact 27 resulting from inclusion of the dielectric encapsulation layer 61 can be less than 0.9 µA/mm, such as less than 0.5 µA/mm or less than 0.2 µA/mm. For example, the reverse bias current of the diode per unit width of the anode contact 27 prior to deposition of the dielectric encapsulation layer 61 can be about 0.1 µA/mm, and the reverse bias current of the diode per unit width of the anode contact 27 after deposition of the dielectric encapsulation layer 61 can be less than 1 µA/mm, such as less than 0.6 µA/mm or less than 0.3 µA/mm. That is, the reverse bias current of the diode per unit width of the anode contact 27 after deposition of dielectric encapsulation layer 61 can be less than 10 times, less than 6 times, or less than 3 times the reverse bias current of the diode per unit width of the anode contact 27 prior to deposition of dielectric encapsulation layer 61.

Dielectric encapsulation layer 61 can be formed of a material that does not cause as much strain on the anode contact 27 as does a conventional material used for encapsulation layers, thereby allowing for use of a conventional anode contact 27 in the device. For example, the dielectric encapsulation layer 61 can be benzocyclobutene (commonly referred to as BCB), spin-on glass, or a combination of $SiN_x$, $SiO_yN_z$, and $SiO_w$. Or, the dielectric encapsulation layer 61 can be formed of a conventional material used for encapsulation layers, such as $SiN_x$ or $SiO_yN_z$, but can be deposited by a method that results in less or different strain induced in the underlying anode contact 27 as compared to when the material is deposited by conventional methods or under conventional deposition conditions. The additional dielectric layer 62 further helps to protect the diode from contaminants in the environment. As in other diode implementations, the diode of FIG. 12 can also include a passivation layer 30 contacting the surface of the III-N materials between the anode contact 27 and the cathode contact 28. The diode can also include an electrode-defining layer, a recess in the III-N materials containing at least a portion of the anode contact 27, and a field plate, for example such as those shown in the diode of FIG. 8.

A number of implementations have been described. Nevertheless, it will be understood that various modifications may be made without departing from the spirit and scope of the techniques and devices described herein. Features shown in each of the implementations may be used independently or in combination with one another. For example, the diodes of FIGS. 2, 10, and 12 may also include a field plate and/or an electrode-defining layer such as those of FIGS. 8 and 11. Accordingly, other implementations are within the scope of the following claims.

What is claimed is:

1. A diode, comprising:
   a III-N material structure;
   an electrically conductive channel in the III-N material structure;
   two terminals, wherein a first terminal is an anode adjacent to the III-N material structure, and a second terminal is a cathode in ohmic contact with the electrically conductive channel; and
   a dielectric layer over at least a portion of the anode; wherein
   the diode is configured such that in operation, when voltage at the anode is less than voltage at the cathode, the diode is in an OFF state and a reverse bias current flows between the anode and the cathode, and when voltage at the anode is greater than voltage at the cathode, the diode is in an ON state and a substantial current flows from the cathode into the anode through the electrically conductive channel;
   and
   the anode comprises a first metal layer comprising nickel adjacent to the III-N material structure, a second metal layer comprising gold, and an intermediary electrically conductive structure between the first metal layer and the second metal layer, the intermediary electrically conductive structure comprising a layer of gold adjacent to the first metal layer and a layer of nickel between the layer of gold and the second metal layer.

2. The diode of claim 1, wherein the III-N material structure comprises a first III-N material layer and a second III-N material layer, and wherein the electrically conductive channel is a 2DEG channel induced in a region of the first III-N material layer adjacent the second III-N material layer as a result of a compositional difference between the first III-N material layer and the second III-N material layer.

3. The diode of claim 2, wherein the first III-N material layer includes GaN.

4. The diode of claim 3, wherein the second III-N material layer includes AlGaN or AlInGaN.

5. The diode of claim 2, further including a third III-N material layer between the first III-N material layer and the second III-N material layer.

6. The diode of claim 5, wherein the third material layer comprises AlN.

7. The diode of claim 2, wherein the first III-N material layer and the second III-N material layer are group III-face or [0 0 0 1] oriented or group-III terminated semipolar layers, and the second III-N material layer is between the first III-N material layer and the dielectric layer.

8. The diode of claim 2, wherein the first III-N material layer and the second III-N material layer are N-face or [0 0 0 1 bar] oriented or nitrogen-terminated semipolar layers, and the first III-N material layer is between the second III-N material layer and the dielectric layer.

9. The diode of claim 1, further comprising a field plate connected to the anode.

10. The diode of claim 1, wherein the dielectric layer comprises $SiN_x$.

11. The diode of claim 1, wherein the dielectric layer is between about 0.2 microns and 20 microns thick.

12. The diode of claim 1, wherein the dielectric layer comprises a first dielectric layer and a second dielectric layer on a side of the first dielectric layer opposite the III-N material structure.

13. The diode of claim 12, wherein the second dielectric layer comprises $SiO_yN_z$.

14. The diode of claim 1, further comprising a dielectric passivation layer between the III-N material structure and the dielectric layer, the dielectric passivation layer contacting a surface of the III-N material structure between the anode and the cathode.

15. The diode of claim 14, wherein the dielectric passivation layer comprises SiN.

16. The diode of claim 14, further including an additional insulating layer between the dielectric layer and the dielectric passivation layer.

17. The diode of claim 16, wherein the additional insulating layer comprises AlN.

18. The diode of claim 1, wherein the intermediary electrically conductive structure results in reduced reverse bias current in the diode compared to a similar diode lacking the intermediary electrically conductive structure.

19. The diode of claim 1, wherein the intermediary electrically conductive structure consists of the layer of gold, the layer of nickel, and a layer of titanium, wherein the layer of titanium is between the layer of nickel and the second metal layer.

20. The diode of claim 1, further comprising an electrode-defining layer between the material structure and the dielectric layer, wherein the electrode-defining layer comprises an aperture with at least a portion of the anode in the aperture.

21. The diode of claim 20, wherein the electrode-defining layer comprises $SiN_x$.

22. The diode of claim 20, wherein the anode includes a portion extending over a surface of the electrode-defining layer.

23. The diode of claim 22, wherein the aperture in the electrode-defining layer includes a step, and the extending portion of the anode is over the step.

24. The diode of claim 22, wherein the portion of the anode extending over the surface of the electrode-defining layer functions as a field plate.

25. The diode of claim 1, wherein the diode is a high-voltage device.

26. The diode of claim 1, wherein the second metal layer is thicker than the first metal layer.

27. The diode of claim 26, wherein the layer of gold in the intermediary conductive structure is between about 3500 and 7500 Angstroms thick.

28. A diode, comprising:
a III-N material structure;
an electrically conductive channel in the material structure;
two terminals, wherein a first terminal is an anode adjacent to the III-N material structure, and a second terminal is a cathode in ohmic contact with the electrically conductive channel;
a dielectric layer over at least a portion of the anode; and
a recess in the III-N material structure; wherein
at least a portion of the anode is in the recess; and
the anode includes a first metal layer comprising nickel adjacent to the III-N material structure, a second metal layer comprising gold, and an intermediary electrically conductive structure between the first metal layer and the second metal layer, the intermediary electrically conductive structure comprising a layer of gold adjacent to the first metal layer and a layer of nickel between the layer of gold and the second metal layer.

29. The diode of claim 28, wherein the III-N material structure comprises a first III-N material layer and a second III-N material layer, the electrically conductive channel is a 2DEG channel induced in a region of the first III-N material layer adjacent the second III-N material layer as a result of a compositional difference between the first III-N material layer and the second III-N material layer, and the recess extends through the 2DEG channel.

30. The diode of claim 28, wherein the recess extends at least 30 nanometers into the III-N material structure.

31. The diode of claim 28, further comprising an electrode-defining layer which is between the III-N material structure and the dielectric layer.

32. The diode of claim 31, wherein the electrode-defining layer comprises SiN.

33. The diode of claim 31, further comprising a dielectric passivation layer between the III-N material structure and the electrode-defining layer, the dielectric passivation layer contacting a surface of the III-N material structure between the anode and the cathode.

34. The diode of claim 33, wherein the dielectric passivation layer comprises SiN.

35. The diode of claim 33, further comprising an additional insulating layer between the dielectric passivation layer and the electrode-defining layer.

36. The diode of claim 35, wherein the additional insulating layer comprises AlN.

37. The diode of claim 35, wherein the additional insulating layer is less than about 20 nanometers thick.

38. The diode of claim 31, wherein the anode includes an extending portion which is over a surface of the electrode-defining layer.

39. The diode of claim 38, wherein the recess is in the electrode-defining layer and includes a step, and the extending portion of the anode is over the step.

40. The diode of claim 38, wherein the extending portion of the anode functions as a field plate.

41. The diode of claim 28, wherein the intermediary conductive structure further includes a layer of titanium.

42. A diode, comprising:
a III-N material structure;
an electrically conductive channel in the III-N material structure;
two terminals, wherein a first terminal is an anode adjacent to the III-N material structure, and a second terminal is a cathode in ohmic contact with the electrically conductive channel; and
a dielectric layer over at least a portion of the anode; wherein
the anode comprises a first metal layer comprising nickel adjacent to the III-N material structure, a second metal layer comprising gold, and an intermediary electrically conductive structure between the first metal layer and the second metal layer, the intermediary electrically conductive structure comprising a layer of gold adjacent to the first metal layer and a layer of nickel between the layer of gold and the second metal layer.

43. The diode of claim 42, further comprising an electrode-defining layer which is between the III-N material structure and the dielectric layer.

44. The diode of claim 43, wherein the electrode-defining layer includes a recess, and at least a portion of the anode is in the recess.

45. The diode of claim 44, wherein the recess includes at least two steps, and the anode includes an extending portion that is over the at least two steps.

46. The diode of claim 45, wherein the recess extends into the III-N material structure.

47. The diode of claim 46, wherein the III-N material structure comprises a first III-N material layer and a second III-N material layer, the electrically conductive channel is a 2DEG channel induced in a region of the first III-N material layer adjacent the second III-N material layer as a result of a compositional difference between the first III-N material layer and the second III-N material layer, and the recess extends through the 2DEG channel.

* * * * *

UNITED STATES PATENT AND TRADEMARK OFFICE
CERTIFICATE OF CORRECTION

PATENT NO.       : 8,772,842 B2
APPLICATION NO.  : 13/040524
DATED            : July 8, 2014
INVENTOR(S)      : Yuvaraj Dora It is certified that error appears in the above-identified patent and that said Letters Patent is hereby corrected as shown below:

On the Title Page, Item (56)

On page 4, column 2, line 31, Other Publications: delete "AIN" and insert --AlN--;

On page 4, column 2, line 40, Other Publications: delete "AIN" and insert --AlN--;

On page 4, column 2, line 44, Other Publications: delete "AIN" and insert --AlN--;

On page 5, column 1, line 64, Other Publications: delete "micowave" and insert --microwave--;

In the Claims

Column 14, line 17, Claim 6: after "third" insert --III-N--;

Column 14, line 18, Claim 6: delete "AIN" and insert --AlN--;

Column 14, line 63, Claim 20: after "the" insert --III-N--;

Column 15, line 19, Claim 28: after "the" insert --III-N--; and

Column 16, line 5, Claim 36: delete "AIN" and insert --AlN--.

Signed and Sealed this
Fourteenth Day of October, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,772,842 B2 | Page 1 of 1 |
| APPLICATION NO. | : 13/040524 | |
| DATED | : July 8, 2014 | |
| INVENTOR(S) | : Yuvaraj Dora | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 284 days.

Signed and Sealed this
Eighth Day of September, 2015

Michelle K. Lee
*Director of the United States Patent and Trademark Office*